United States Patent

Krause et al.

(10) Patent No.: US 9,109,302 B2
(45) Date of Patent: Aug. 18, 2015

(54) METHOD FOR PRODUCING SILICON WAFERS, AND SILICON SOLAR CELL

(75) Inventors: Andreas Krause, Radebeul (DE); Juliane Walter, Halsbrücke / Niderschöna (DE); Marc Dietrich, Broβschirma (DE); Josef Stenzenberger, Freiberg (DE)

(73) Assignee: SolarWorld Innovations GmbH, Freiberg (DE)

( * ) Notice: Subject to any disclaimer, the term of this patent is extended or adjusted under 35 U.S.C. 154(b) by 477 days.

(21) Appl. No.: 13/154,914

(22) Filed: Jun. 7, 2011

(65) Prior Publication Data

US 2011/0297223 A1 Dec. 8, 2011

(30) Foreign Application Priority Data

Jun. 7, 2010 (DE) .......................... 10 2010 029 741

(51) Int. Cl.
*C30B 29/06* (2006.01)
*C30B 11/14* (2006.01)
*H01L 31/18* (2006.01)

(52) U.S. Cl.
CPC ................ *C30B 29/06* (2013.01); *C30B 11/14* (2013.01); *H01L 31/182* (2013.01); *Y02E 10/546* (2013.01)

(58) Field of Classification Search
CPC ........ C30B 29/06; C30B 11/14; C30B 15/36; C30B 13/00
USPC ............................................. 117/63; 136/256
See application file for complete search history.

(56) References Cited

U.S. PATENT DOCUMENTS

| 5,529,051 | A | * | 6/1996 | Miller | ............................. 125/12 |
| 6,451,218 | B1 | | 9/2002 | Holdermann | |
| 7,423,242 | B2 | | 9/2008 | Dietrich et al. | |
| 2005/0139149 | A1 | * | 6/2005 | Maeda et al. | .................... 117/13 |
| 2006/0000409 | A1 | * | 1/2006 | Spangler et al. | ................ 117/81 |
| 2007/0169684 | A1 | * | 7/2007 | Stoddard | ......................... 117/13 |
| 2007/0169685 | A1 | | 7/2007 | Stoddard | |
| 2008/0179037 | A1 | * | 7/2008 | Yoshihara et al. | ............ 164/460 |
| 2008/0264207 | A1 | | 10/2008 | Muller et al. | |

(Continued)

FOREIGN PATENT DOCUMENTS

| DE | 19811878 | 9/1999 |
| DE | 102005037393 | 2/2007 |
| DE | 102006020234 | 10/2007 |

(Continued)

OTHER PUBLICATIONS

"Crystal Planes in Silicon" Evidentiary Reference.*

(Continued)

*Primary Examiner* — Jennifer Michener
*Assistant Examiner* — Sadie White
(74) *Attorney, Agent, or Firm* — Patterson & Sheridan, LLP

(57) ABSTRACT

In order to produce silicon wafers, liquid ultra-pure silicon is solidified on a silicon monocrystalline seed arranged in the bottom area of a crucible and having a seed surface comprising a {110}-crystal orientation and an edge surface having a {100}-crystal orientation starting from the bottom of the crucible, thus forming a silicon block on the seed surface of the silicon monocrystalline seed which largely takes over the {110}-crystal orientation. Subsequently, the silicon block is divided into wafers with a wafer surface having a {100}-crystal orientation.

13 Claims, 5 Drawing Sheets

(56) References Cited

U.S. PATENT DOCUMENTS

2009/0047203 A1* 2/2009 Mueller et al. .............. 423/348
2010/0320638 A1 12/2010 Reimann et al.

FOREIGN PATENT DOCUMENTS

| DE | 102007035756 | 2/2009 |
| EP | 1485956 | 12/2004 |
| WO | 2009100694 | 8/2009 |

OTHER PUBLICATIONS

J. C. Brice and P. Rudolph, "Crystal Growth", Published Online: Apr. 15, 2007, Ullmann's Encyclopedia of Industrial Chemistry [online]. DOI: 10.1002/14356007.a08_099.pub2.

* cited by examiner

METHOD FOR PRODUCING SILICON WAFERS, AND SILICON SOLAR CELL

The present invention relates to a method for producing silicon wafers and their further processing to obtain solar cells.

Solar cells are electronic components which convert electro-magnetic radiant energy, preferably sunlight, directly into electric energy. The basic material for solar cells is usually silicon. In the case of silicon solar cells, a distinction is made between monocrystalline and polycrystalline cells. Monocrystalline cells are characterized by a high large-scale efficiency of more than 20% in parts, however, they require a high amount of energy during their production. Polycrystalline cells, on the other hand, have lower efficiency, but relatively short energy amortisation times.

Monocrystalline silicon cells are usually produced from monocrystalline silicon discs, which are also known as silicon wafers, their production involving a high amount of energy as well as relatively high costs. In order to produce monocrystalline silicon wafers, crystal rods consisting of super-purity silicon are first produced and then cut into discs, preferably by means of wire-sawing. A method requiring high energy input and high costs in order to produce monocrystalline silicon wafers is the Czochralski method in which cylindrical rods are generated which then have to be cut into rectangular discs for producing wafers for solar cells. A further known method for producing monocrystalline silicon wafers is the floating zone process, however, the costs are similarly high as in the case of the Czochralski method. In this method as well, the produced cylindrical silicon rods for the silicon wafers have to be cut to size in order to generate solar cells.

DE 10 2007 035 756 A1 proposes an inexpensive method for cultivating large-volume silicon single crystals which is based on the vertical Bridgman method and/or the vertical-gradient-freeze method. In these known methods, ultra-pure silicon is melted in a crucible at more than 1400° C. By means of slow cooling of the molten mass, zones of homogenous crystal structures emerge, whereby solidifying starts from the bottom of the crucible. Thus, silicon blocks having an edge length up to 70 cm and heights up to 30 cm may be manufactured. The large silicon blocks are then cut into silicon ingots which are in turn sawed to produce thin discs in order to produce silicon wafers.

By means of the conventional vertical Bridgman method and/or the vertical-gradient-freeze technique, however, only poly-crystalline silicon cells may be produced. In the method proposed in DE 10 2007 035 756, a large-area monocrystalline silicon seed is arranged in the bottom area of the crucible in order to generate an essentially monocrystalline silicon block. During the silicon block production, the area of the seed is partially molten and upon solidifying confers its crystalline orientation to the melt, so that an essentially monocrystalline silicon block may be produced.

After dividing up the silicon block into silicon wafers, the wafer area comprises numerous organic and inorganic impurities as well as damages of the crystalline structure up to a depth of several micrometers due to the wire-sawing process. Within the framework of the solar cell production, sawing damages are removed in a first step. In addition to removing the damages caused by sawing, what is known as structuring is carried out on the silicon wafer surface, also referred to as texturizing of the wafer surface, whereby the efficiency of the solar cells may be significantly increased. Texturizing of the wafer surface substantially improves the actual injection of light. Texturizing is usually effected by means of wet chemistry and dry chemistry etching techniques, particularly by means of an alkaline etching solution, whereby only crystalline surfaces characterized with {100} according to the Miller index are suitable silicon wafers for texturizing.

According to the Miller indices, crystal levels are characterized by integral number triplets (hkl) referring to the three spatial axes. If crystallographically equivalent levels are to be characterized, as well, instead of a specific crystal level, this is indicated by the notation {hkl}. The spatial axes in the crystal grid are also characterized by a number triplet [uvw] according to the Miller indices referring to the three spatial directions. The notation <uvw> then characterizes all spatial directions which are crystallographically equivalent to the spatial direction [uvw].

During the crystallization of monocrystalline silicon blocks, particularly according to the modified vertical Bridgman and/or the vertical-gradient-freeze technique proposed in DE 10 2005 037 393 A1, it has been shown, however, that a crystal growth with {100}-wafer surfaces is very susceptible to the formation of defects, particularly with regard to displacement clusters during crystal growth. The particular danger thereby is that the generated displacements spread in the solidifying silicon block in an unimpeded manner due to the missing grain boundaries, which considerably affects the quality of the crystal structure and thus the efficiency of the silicon solar cell.

It is the object of the present invention to provide a method by means of which monocrystalline silicon wafers with little defects and a surface suitable for texturizing may be produced. Furthermore, it is the object of the invention to produce silicon solar cells with high efficiency on the basis of such silicon wafers.

This object is solved by a method for producing silicon wafers according to claim 1 and a silicon solar cell according to claim 9 wafer according to claim 7 as well as its use according to claim 10. Preferred embodiments are indicated in the dependent claims.

For producing silicon wafers, according to the invention a monocrystalline silicon seed having a {110}-seed surface and an {100}-edge surface oriented perpendicularly thereto are provided in the bottom area of a crucible containing liquid ultra-pure silicon. Starting from the bottom area of the crucible, the liquid ultra-pure silicon is then solidified, whereby a silicon block forms on the seed surface of the monocrystalline silicon seed having a largely aligned crystal grid. The silicon block is subsequently cut into the wafers in parallel to the edge surface of the monocrystalline silicon seed so that a wafer surface comprises a <100>-crystal orientation. Thereby, the wafer surface of the <100>-crystal orientation comprises a structure which is more than 70% monocrystalline.

The method according to the invention allows for the inexpensive production of low-defect monocrystalline silicon wafers having a <100>-crystal orientation of the wafer surface, the silicon wafers being suitable for alkaline texturizing. For this purpose, crystal growth is initiated on a {110}-crystal surface which is less susceptible to the formation of displacements, whereby, however, a {100}-surface of the silicon block is simultaneously formed alongside a marked edge surface of the monocrystalline silicon seed. In parallel to said {100}-surface of the silicon block, the monocrystalline silicon block is then cut into silicon wafers. The {100}-wafer surface may then be effectively texturized. The method according to the invention is furthermore marked by the fact that the monocrystalline silicon block may be separated into rectangular silicon wafers for solar cells without any previous squaring process, so that an optimal utilization of space may be achieved.

In order to produce silicon solar cells, the monocrystalline silicon wafer surfaces having a {100}-crystal orientation are processed by means of an alkaline monotexture. Subsequently, a p/n junction is generated in the silicon wafer. In a further step, the silicon wafer surface is annealed. Finally, the silicon wafer surface as well as the silicon wafer back-surface are provided with contacts in order to complete the silicon solar cell. By means of this technique, solar cells with high efficiency may be produced inexpensively and with an efficient use of space.

According to a preferred embodiment, the silicon monocrystalline seed for the crystal growth of the silicon block is produced from a monocrystalline silicon ingot, the ingot axis of which has a <100>-crystal orientation, whereby the monocrystalline silicon ingot is cut open in order to form the seed area of the silicon monocrystalline seed having the <110>-crystal orientation as well as the edge surface of the silicon monocrystalline seed having the <100>-crystal orientation. Thus, by means of the Czochralski technique or the floating zone process, the silicon monocrystalline seed may be produced with a standard crystal orientation in a conventional manner, whereby the silicon monocrystalline ingot is squared and cut open at an 45° angle to the squared surface in order to produce a seed.

The present invention is explained in more detail by means of the accompanying drawings, in which.

Figure 1:
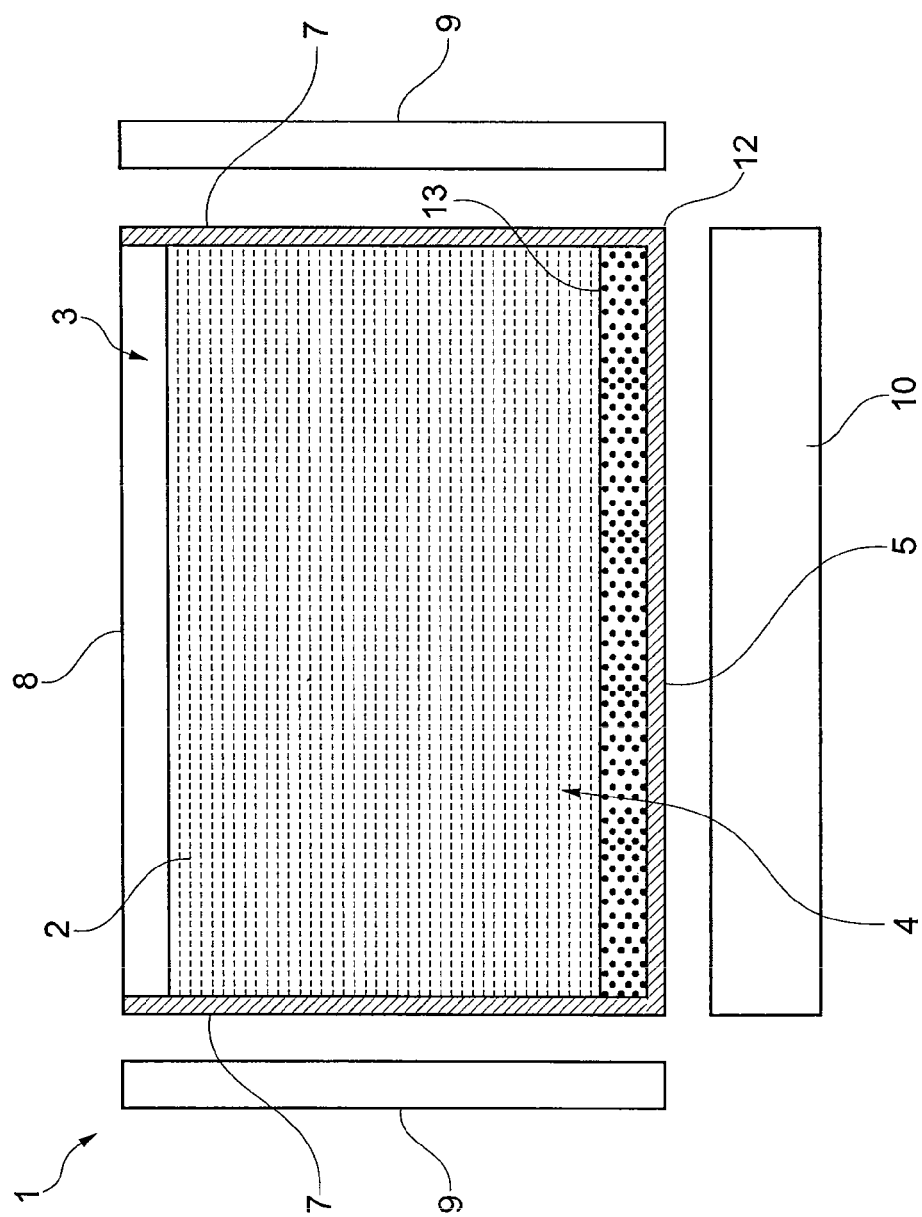
FIG. 1 is a schematic lateral sectional view of a device for melting and crystallizing silicon blocks using a silicon monocrystalline seed in the bottom area.

By means of the device for melting and crystallizing ultrapure silicon shown schematically in FIG. 1, low-defect monocrystalline silicon blocks may be produced. Thereby, the size of the block may comprise an edge length of 70 cm and more, as well as a height of 30 cm and more. The height of the block may also be chosen to be less and may e.g. correspond to the outer edge length of a standard solar cell wafer of 15.6 cm in addition to a bottom and top section which is not useable for a solar cell wafer. A lower block height has the advantage that the diffusion of impurities from the crucible into the forming silicon block is reduced due to shorter crystallization times.

The device for melting an crystallizing ultra-pure silicon comprises a crucible 3 essentially comprising the shape of a cuboid open towards the top. The interior 4 of the crucible 3 is limited on five sides and comprises a bottom 5 and four sidewalls 7. The interior 4 of the crucible 3 may be filled via an aperture 8 which is located opposite to the bottom 5. On the outer side of the crucible 3, heating elements 9 and cooling elements 10 are arranged by means of which the interior 4 of the crucible 3 may specifically be heated and/or cooled. The heating elements 9 and/or the cooling elements 10 are thereby e.g. configured according to the known vertical Bridgman technique and/or the vertical-gradient-freeze technique.

In order to produce a monocrystalline silicon block of ultra-pure silicon, a silicon monocrystalline seed 12 is arranged on the bottom 5 of the crucible 3. The silicon monocrystalline seed 12 thereby covers the entire bottom surface of the crucible 3, the bottom surface being preferably configured as a square or rectangle, but possibly also having a polygonal shape.

Figure 2:
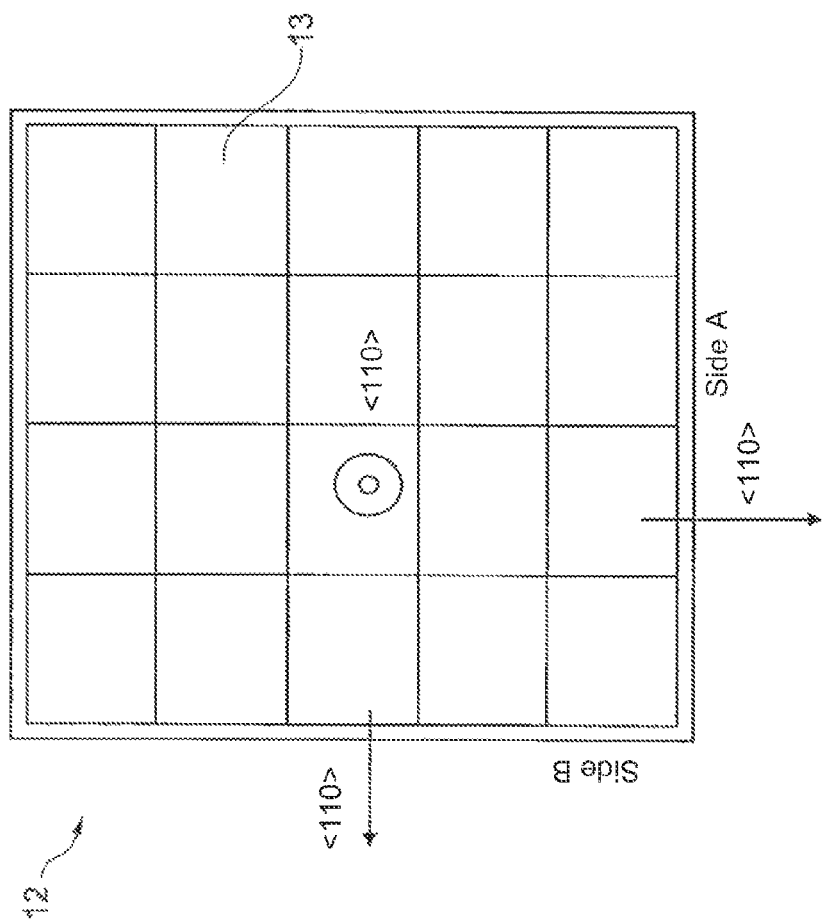
FIG. 2 is a top view of rectangular silicon monocrystalline seeds for use in the device of FIG. 1, displayed in a fully surfaced manner in the bottom area.

FIG. 2 shows a top view onto the silicon monocrystalline seed 12 for a rectangular crucible bottom. The silicon monocrystalline seed 12 comprises a seed surface 13 which is arranged in parallel to the bottom 5 of the crucible 3. The silicon monocrystalline seed 12 preferably has a disc-shape with a thickness of one or more cm, preferably about 4 cm. The silicon monocrystalline seed 12 may be in one piece or it may be composed of several partial seeds of 20 rectangular discs, as shown in FIG. 2. The orientation of the seed surface 13 of the silicon monocrystalline seed 12 is—when indicated as Miller indices—{110}. The silicon crystal has what is referred to as a diamond structure in which eight silicon atoms are located in each unit cube. Thereby, the surface of the silicon unit cube is flat-centered cubic. FIG. 2 shows the silicon monocrystalline seed 12 with a {110}-seed surface 13, the <110>-crystal orientation of which is indicated perpendicularly to the detail level by means of the circle around the z axis. The parts of the silicon monocrys-talline seed may comprise a shape other than a rectangular one, e.g. a hexagonal shape, whereby the composite parts cover the bottom area 5 of the crucible 3 almost across the entire surface and with the same direction of crystal orientation.

Furthermore, the silicon monocrystalline seed 12 is configured in such a way that an edge surface comprises a <100>-crystal orientation. This edge surface then forms a side face of the silicon block to be produced and will in the following be referred to as face-A-edge surface. In the case of the silicon monocrystalline seed 12 shown in FIG. 2 and having a {110}-seed surface 13, the face-A-edge surface has a <100>-crystal orientation, the face B edge surface perpendicular thereto has a <110>-crystal orientation.

The silicon monocrystalline seed and/or the seed parts are preferably produced from monocrystalline silicon rods manufactured by means of the Czochralski technique or the floating zone process. By means of the Czochralski technique and/or the floating zone process, monocrystalline cylindrically shaped silicon bars having high purity may be produced, the surfaces of the silicon rods in principle having a <100>-crystal orientation. In order to produce silicon monocrystalline seeds 12 according to FIG. 2 having a {110}-seed surface 13 and a {100}-side-A-edge surface, the cylindrically shaped silicon rods are then cut into squares and sawed at a 45° angle with regard to the squared surface in order to obtain discs.

However, the silicon monocrystalline seeds 12 may also be produced by means of other monocrystalline manufacturing methods, e.g. by means of the extended vertical Bridgman technique and/or vertical-gradient-freeze technique disclosed in DE 10 2007 035 756 A1, in which monocrystalline silicon blocks are produced on a seed structure. In this context, it is also possible to produce the silicon monocrystalline seeds directly with a {110}-seed surface 13 and a {100}-side-A-edge surface. Moreover, the silicon monocrystalline seeds may also be produced from the silicon blocks manufactured by means of the methods according to the invention by sawing out corresponding discs having a {110}-seed surface and a {100}-side-A-edge surface. In addition, the silicon monocrystalline seeds may be re-used after generating the silicon blocks by subsequently separating them from said silicon blocks. Preferably, the bottom section is used for this purpose, which is generally unsuitable for the production of solar cell wafers.

In order to produce the silicon blocks, the crucible 3 containing the silicon monocrystalline seed 12 in the bottom area 5 is filled with liquid high-purity silicon 2 via the aperture of the crucible 8. Instead of filling the crucible with liquid ultra-pure silicon 2, powdery, granular or fragmentized silicon may also be used, the silicon then being melted by means of the heating elements 9 arranged at the crucible 3. Thereby, the temperature is to be regulated in such a way that the provided seed at the bottom 5 of the crucible 3 is surface-melted, but not liquefied. The liquid ultra-pure silicon 2 on the silicon monocrystalline seed 12 is then aligned and crystallized as well as allowed to solidify specifically. In this context, solidifying of the silicon starts at the seed surface 13 of the silicon monocrystalline seed 12 and runs towards the top. In order to crystallize the liquid ultra-pure silicon 2 in a controlled manner, heat is actively dissipated from the liquid ultra-pure silicon 2 by means of the cooling elements 10 at the crucible 3.

Thereby, crystallization takes place in such a way that the seed surface 13 of the silicon monocrystalline seed 12 inherits its <100>-crystal orientation to the silicon block growing on the silicon monocrystalline seed. The silicon block forming on the seed surface 13 of the silicon monocrystalline seed 12 comprises a crystal grid with a {110}-growth surface which is largely aligned with the silicon monocrystalline seed 12. Simultaneously, a {100}-oriented silicon block surface forms over the side-A-edge surface of the silicon monocrystalline seed 12. The inheriting of the crystal orientation of the silicon monocrystalline seed 12 to the silicon block forming thereon is preferably supported by the fact that the silicon monocrystalline seed 12 is surface-melted at its seed surface 13 before solidifying takes place.

Figure 3:
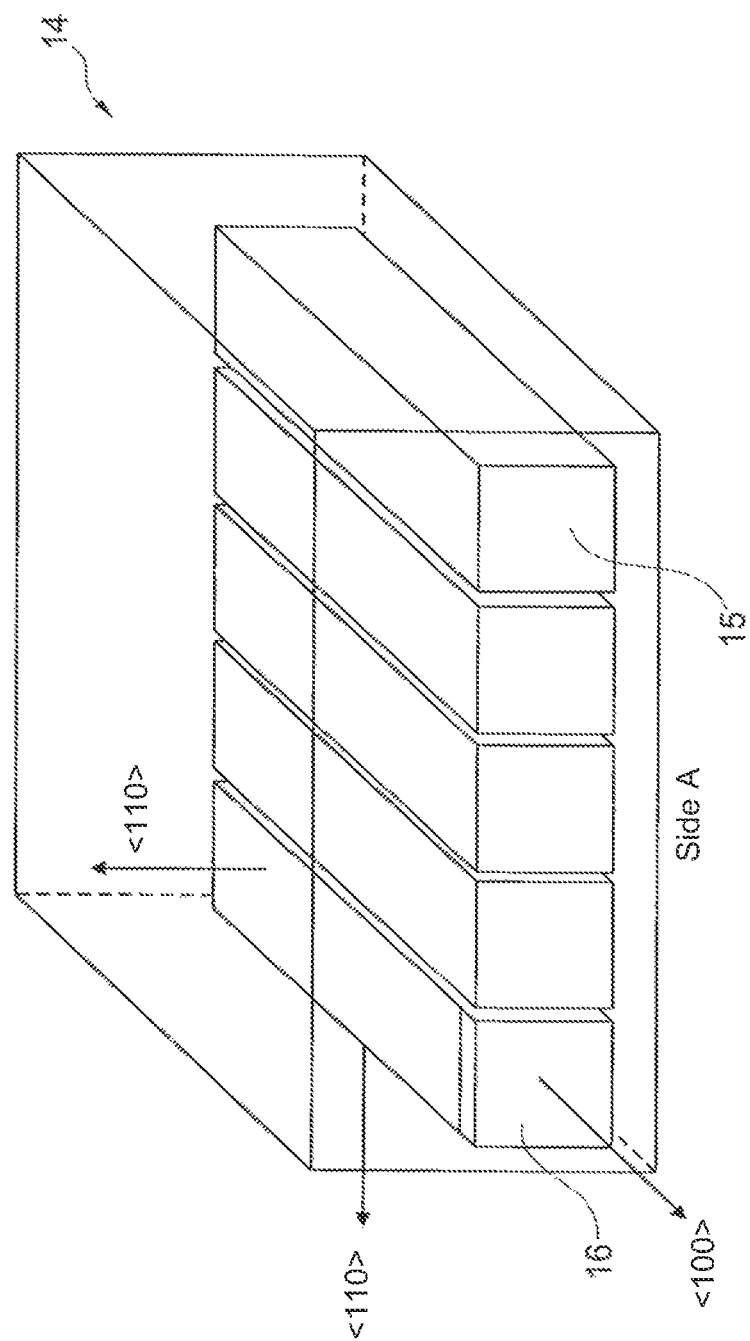
FIG. 3 depicts a silicon block produced by means of the device shown in FIG. 1.

FIG. 3 shows a silicon block 14 which was generated on the silicon monocrystalline seed 12 shown in FIG. 2 by means of the device depicted in FIG. 1. The silicon block 14 is marked by an essentially low-defect crystal structure which is formed by growing on the {110}-seed surface 13 of the silicon monocrystalline seed 12. The growth on the {110}-seed surface 13 essentially takes place without displacement, the [110]-direction of growth ensuring that the crystal defects which are being formed do not spread. The silicon block produced by means of the method of the invention thereby comprises a high crystal quality and has a structure which is more than 70% monocrystalline.

For silicon wafer production, the silicon block 14 is then divided into sections, preferably by means of the known wire-sawing method. It is thereby also possible to re-use the silicon monocrystalline seed 12 after it has been separated from the silicon block 14. Moreover, further silicon monocrystalline seeds may be produced from the silicon block 14, e.g. by cutting off the top or bottom section.

The silicon block 14 is preferably sawed to obtain cuboid-shaped ingots 15, the silicon ingots e.g. having a surface area of 15.6×15.6 $cm^2$. In order to produce the silicon ingots 15, the silicon block 14 is divided perpendicularly to the {100}-silicon block area, as shown in FIG. 3. The longitudinal axis of the silicon ingots then runs in parallel to the bottom area of the crucible and to the growth area of the monocrystalline seed. What is referred to as horizontal ingots is formed.

The silicon wafers 16 themselves are produced from the individual silicon ingots 15 by dividing them in parallel to the {100}-ingot area. The thickness of the silicon wafers 16 is determined depending upon the later application and/or design of the silicon cell to be produced therefrom. Thereby, the silicon wafers have the crystalline quality of the silicon block, i.e. more than 70% of the wafer surface having the [100]-crystal <100>-crystal orientation comprise a monocrystalline structure.

Furthermore, it is also possible to cut out one or more layers of what is referred to as horizontal ingots from a medium-height section of the silicon block 14 and to thus divide the remaining upper and/or lower section of the silicon block into silicon ingots, so that their longitudinal axis runs perpendicularly to the bottom area of the crucible and to the growth area of the monocrystalline seed.

During the growth of the silicon block 14 by means of the device shown in FIG. 1, different distributions regarding the carbon or oxygen concentration may occur due to the controlled crystallization of the ultra-pure silicon in the silicon block 14. This also applies to the conductivity of the silicon which may be different within the silicon block 14. Thereby, the carbon or oxygen concentration and/or the conductivity varies in the direction of silicon block growth, i.e. in the direction of the <110>-crystal orientation. The gradient of carbon or oxygen concentration and/or the conductivity is then displayed on the wafer surface of the silicon wafer having the <100>-crystal orientation.

Figure 4:
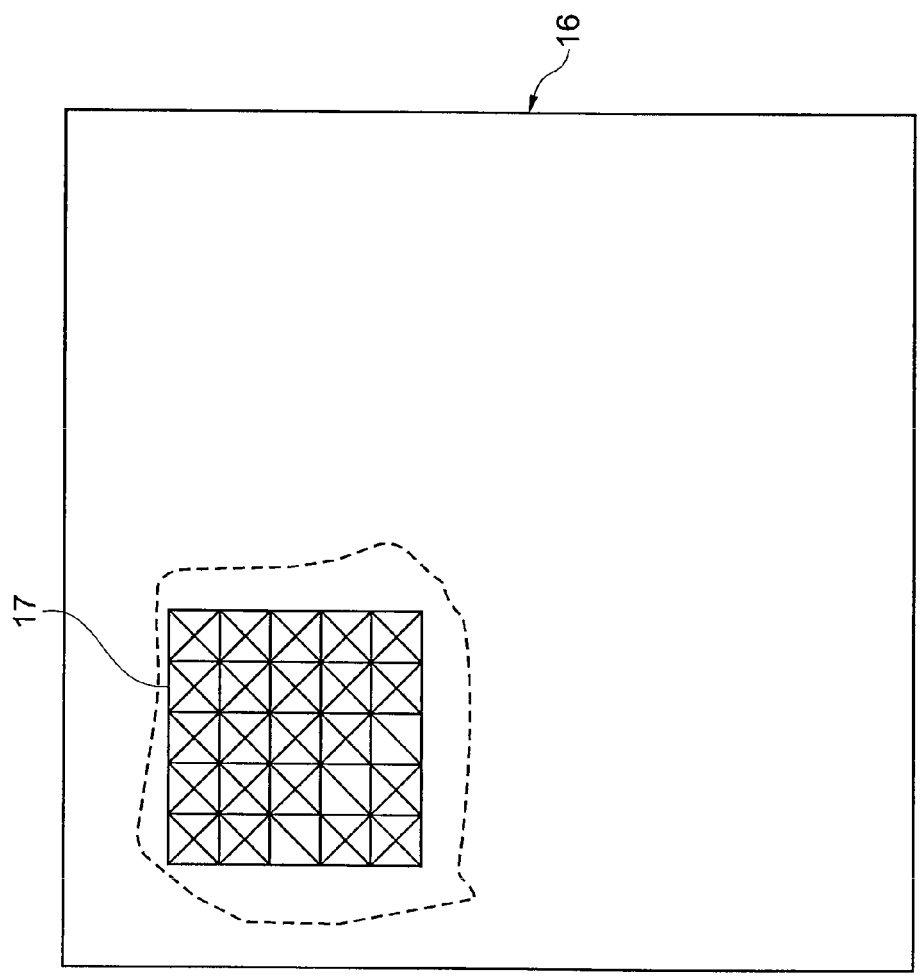
FIG. 4 shows a silicon wafer having a wafer surface and a pyramidal texturizing.

In order to process the silicon wafer 16 to produce solar cells, the silicon wafers are subjected to chemical baths in order to repair damages caused by sawing. For this purpose, wet chemistry methods, preferably using alkaline solutions, are generally used. In connection with removing the sawing damages, the {100}-silicon wafer surface is additionally subjected to structuring, conferring to it what is referred to as the texture. The texture of the wafer surface provides improved light injection due to reduced reflection losses and thus improved solar cell efficiency. Texturizing is thus effected by means of wet or dry chemistry etching, preferably an alkaline monotexture, whereby a pyramid structure 17 is preferably produced on the wafer surface, as shown in a detail of FIG. 4. The edges of the surface area of the pyramid-shaped elevations 17 are thereby in parallel to the outer edges of the wafer surface of the silicon wafer 16.

Figure 5:
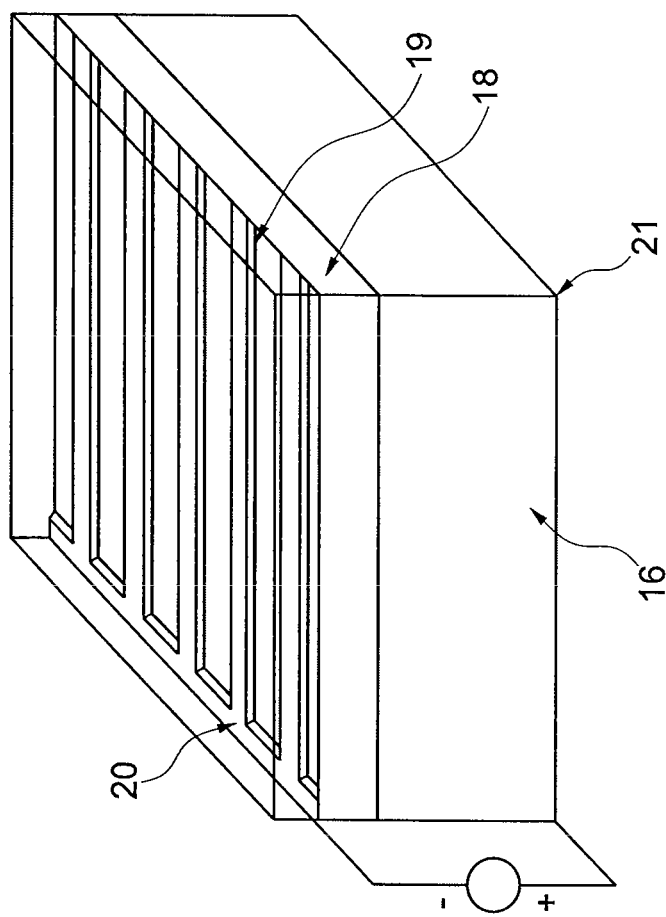
FIG. 5 schematically depicts the basic design of a monocrystalline silicon solar cell.

FIG. 5 depicts the further processing of the silicon wafer 16 to obtain a silicon solar cell. After producing the texture, a high-temperature step is carried out in which a p/n junction 18 is produced by doping the silicon wafer 16, preferably by means of phosphor diffusion. Subsequently, the silicon wafer surface is annealed, preferably by applying an anti-reflective layer 19. In order to finish the silicon solar cell, front-side and back-side contacts 20, 21 are deposited on the silicon wafer 16, preferably by means of screen printing.

The invention claimed is:

1. A method for producing silicon wafers, comprising the steps of:

providing a silicon monocrystalline seed in the bottom area of a crucible, the silicon monocrystalline seed having a seed surface with a <110>-crystal orientation, the <110>-crystal orientation being perpendicular to the bottom area of the crucible, and an edge surface with a <100>-crystal orientation, the <100>-crystal orientation being perpendicular to a side face of the crucible;

surface-melting silicon and providing it in the crucible;

solidifying the liquid silicon starting from the bottom area of the crucible on the seed surface of the silicon monocrystalline seed to form a silicon block, whereby the silicon block takes over the <110>-crystal orientation and as a structure which is more than 70% monocrystalline; and dividing the silicon block into wafers in such a way that a main wafer surface comprises a <100>-crystal orientation, the main wafer surface being delimited by four wafer edges, wherein two respectively opposite wafer edges of the four wafer edges run parallel to the [110]-crystal direction.

2. The method of claim 1, wherein the silicon monocrystalline seed is produced from a monocrystalline silicon ingot, the ingot axis having a [100]-spatial orientation, whereby the monocrystalline silicon ingot for forming the seed surface of the silicon monocrystalline seed having the <110>-crystal orientation and the edge surface of the silicon monocrystalline seed having the <100>-crystal orientation is cut open.

3. The method of claim 1, wherein the silicon monocrystalline seed consists of several parts covering the bottom area of the crucible with the same crystal orientation.

4. The method of claim 1, wherein prior to cutting into wafers the silicon block is divided into rectangular silicon ingots in such a way that an ingot axis runs in parallel to the seed surface of the silicon monocrystalline seed.

5. The method of claim 1, wherein the wafer surface having the <100>-crystal orientation is subjected to texture etching by means of an alkaline etching solution.

6. The method of claim 2, wherein the silicon monocrystalline seed consists of several parts covering the bottom area of the crucible with the same crystal orientation.

7. The method of claim 2, wherein prior to cutting into wafers the silicon block is divided into rectangular silicon ingots in such a way that the ingot axis runs in parallel to the seed surface of the silicon monocrystalline seed.

8. The method of claim 3, wherein prior to cutting into wafers the silicon block is divided into rectangular silicon ingots in such a way that an ingot axis runs in parallel to the seed surface of the silicon monocrystalline seed.

9. The method of claim 2, wherein the wafer surface having the <100>-crystal orientation is subjected to texture etching by means of an alkaline etching solution.

10. The method of claim 3, wherein the wafer surface having the <100>-crystal orientation is subjected to texture etching by means of an alkaline etching solution.

11. The method of claim 4, wherein the wafer surface having the <100>-crystal orientation is subjected to texture etching by means of an alkaline etching solution.

12. The method of claim 1, wherein the edge face with the <100>-crystal orientation is perpendicular to a bottom surface of the crucible, wherein the bottom surface is perpendicular to the side face of the crucible.

13. The method of claim 1, wherein the seed surface with the <110>-crystal orientation is parallel with a bottom surface of the crucible, wherein the bottom surface is perpendicular to the side face of the crucible.

* * * * *